United States Patent [19]

Iizuka et al.

[11] Patent Number: 4,855,741
[45] Date of Patent: Aug. 8, 1989

[54] LOGARITHMIC DIGITAL LEVEL DISPLAY DEVICE

[75] Inventors: Hiroshi Iizuka; Shizuo Kakiuchi, both of Saitama, Japan

[73] Assignee: Pioneer Electronic Corporation, Tokyo, Japan

[21] Appl. No.: 87,112

[22] Filed: Aug. 19, 1987

[30] Foreign Application Priority Data

Aug. 19, 1986 [JP] Japan .................................. 61-195059

[51] Int. Cl.⁴ .............................................. H03M 7/50
[52] U.S. Cl. ......................................... 341/75; 341/84
[58] Field of Search ................ 370/247 DD; 364/756, 364/781; 341/62, 75, 83-85, 104

[56] References Cited

U.S. PATENT DOCUMENTS 4,626,825 12/1986 Burleson et al. ...................... 341/75
4,719,450 1/1988 Yamauchi .................... 340/347 DD

OTHER PUBLICATIONS

"Analog–Digital Conversion Notes"; Analog Devices Inc.; 1980; p. 64.

Primary Examiner—William M. Shoop, Jr.
Assistant Examiner—Marc S. Hoff
Attorney, Agent, or Firm—Sughrue, Mion, Zinn, Macpeak & Seas

[57] ABSTRACT

A digital level display in which a digital input signal has its highest order non-zero part logarithmically converted by a first decoder and its lower order part logarithmically converted by a second decoder. The outputs of the two decoders are added to be displayed.

13 Claims, 2 Drawing Sheets

| AREA | | PL (P) | | ADB | DIA | | | | OVER-FLOW |
|---|---|---|---|---|---|---|---|---|---|
| NUMBER | (dB) | 14 13 12 11 10 9 8 7 6 5 4 3 2 1 0 | | 6543210 | | | | | |
| 0 | 84~ (90) | 1 | | 1010100 | $P_{13}$ | $P_{12}$ | $P_{11}$ | $P_{10}$ | 0 |
| 1 | 78~ | 0 1 | | 1001110 | $P_{12}$ | $P_{11}$ | $P_{10}$ | $P_9$ | 0 |
| 2 | 72~ | 0 0 1 | | 1001000 | $P_{11}$ | $P_{10}$ | $P_9$ | $P_8$ | 0 |
| 3 | 66~ | 0 0 0 1 | | 1000010 | $P_{10}$ | $P_9$ | $P_8$ | $P_7$ | 0 |
| 4 | 60~ | 0 0 0 0 1 | | 0111100 | $P_9$ | $P_8$ | $P_7$ | $P_6$ | 0 |
| 5 | 54~ | 0 0 0 0 0 1 | | 0110110 | $P_8$ | $P_7$ | $P_6$ | $P_5$ | 0 |
| 6 | 48~ | 0 0 0 0 0 0 1 | | 0110000 | $P_7$ | $P_6$ | $P_5$ | $P_4$ | 0 |
| 7 | 42~ | 0 0 0 0 0 0 0 1 | | 0101010 | $P_6$ | $P_5$ | $P_4$ | $P_3$ | 0 |
| 8 | 36~ | 0 0 0 0 0 0 0 0 1 | | 0100100 | $P_5$ | $P_4$ | $P_3$ | $P_2$ | 0 |
| 9 | 30~ | 0 0 0 0 0 0 0 0 0 1 | | 0011110 | $P_4$ | $P_3$ | $P_2$ | $P_1$ | 0 |
| 10 | 24~ | 0 0 0 0 0 0 0 0 0 0 1 | | 0011000 | $P_3$ | $P_2$ | $P_1$ | $P_0$ | 0 |
| 11 | 0~ | 0 0 0 0 0 0 0 0 0 0 x x x x | | 0000000 | 0 | 0 | 0 | 0 | 0 |
| | ALL 1 | 1 1 1 1 1 1 1 1 1 1 1 1 1 1 1 | | 1010100 | 1 | 1 | 1 | 1 | 1 |

| IN | (DB) | OUT |
|---|---|---|
| DIA | BASE-10 VALUE | DBIA |
| 0F | 5.74 | 6 |
| 0E | 5.46 | 5 |
| 0D | 5.17 | 5 |
| 0C | 4.86 | 5 |
| 0B | 4.54 | 4 |
| 0A | 4.22 | 4 |
| 09 | 3.88 | 4 |
| 08 | 3.52 | 3 |
| 07 | 3.15 | 3 |
| 06 | 2.77 | 3 |
| 05 | 2.36 | 2 |
| 04 | 1.94 | 2 |
| 03 | 1.49 | 1 |
| 02 | 1.02 | 1 |
| 01 | 0.53 | 0 |
| 00 | 0 | 0 |

| IN (DIA) | | OUT (DBIA) | |
|---|---|---|---|
| HEX | BIN | HEX | BIN |
| F | 1 1 1 1 | 6 | 1 1 0 |
| E | 1 1 1 0 | 5 | 1 0 1 |
| D | 1 1 0 1 | 5 | 1 0 1 |
| C | 1 1 0 0 | 5 | 1 0 1 |
| B | 1 0 1 1 | 4 | 1 0 0 |
| A | 1 0 1 0 | 4 | 1 0 0 |
| 9 | 1 0 0 1 | 4 | 1 0 0 |
| 8 | 1 0 0 0 | 3 | 0 1 1 |
| 7 | 0 1 1 1 | 3 | 0 1 1 |
| 6 | 0 1 1 0 | 3 | 0 1 1 |
| 5 | 0 1 0 1 | 2 | 0 1 0 |
| 4 | 0 1 0 0 | 2 | 0 1 0 |
| 3 | 0 0 1 1 | 1 | 0 0 1 |
| 2 | 0 0 1 0 | 1 | 0 0 1 |
| 1 | 0 0 0 1 | 0 | 0 0 0 |
| 0 | 0 0 0 0 | 0 | 0 0 0 |

LOGARITHMIC DIGITAL LEVEL DISPLAY DEVICE

BACKGROUND OF THE INVENTION

1. Field of the Invention

The present invention generally relates to a digital level display device. It particularly relates to a digital level display device effectively used in a compact disk (CD) player, a digital audio tape recorder (DAT), or the like.

2. Background of the Invention

In a PCM recording/reproducing apparatus such as a CD player, a DAT, or the like, an analog audio signal is digitized so as to be recorded on a recording medium. During reproducing, a reproduced digital signal is converted into an analog signal which is sent out as an output. FIG. 4 is a block diagram showing an example of the conventional digital level display device used, for example, for monitoring a level of a digital signal in such a PCM recording/reproducing apparatus as described above.

An absolute value signal of n bits representing an absolute value of a digital signal is applied to terminals 1, 2, 3, ..., n in such a manner that the respective n bits are connected to the n terminals with a one-to-one correspondence. The most significant bit (MSB) and the least significant bit (LSB) of the absolute value signal are connected to the terminals 1 and n respectively. Assuming now that the bit applied, for example, to the terminal 2 is the most significant bit of all the non-zero bits (i.e., of logic "1" or high level), the output of an OR circuit 24 corresponding to the terminal 2 becomes logic "1". As a result, the output of an inverter 35 becomes logic "0" (low level), so that a current from a predetermined power source (+V) is allowed to flow through a resistor 55 into a light emitting diode 45 to make it light.

• The output of the OR circuit 24 is applied to a lower-order OR circuit 25, and the output of the OR circuit 25 is applied to a lower-order OR circuit 26. The operation described above is repeated so that all the light emitting diodes 46, 47, ..., located lower in order than the light emitting diode 45 are made light.

The arrangement is made such that the n-th bit down of the data drives the light emitting diode for display of −6n dB. Accordingly, the level of a digital signal can be indicated in steps of 6 dB. The gradation by 6 dB is not precise since a factor of two variation in voltage (one bit place) is a variation of 6.03 dB.

Logarithmic decoders 11, 12, 13, ... are provided for making the display have a resolution of 3 dB. For example, in the case where the bits of the data at the terminals 1 and 2 are logic "0" and "1" respectively, and when the level of the data is not smaller than 3 dB above the level represented by terminal 2, the decoder 13 produces an output of logic "1". As a result, an OR circuit 23 produces an output of logic "1" and an inverter 34 produces an output of logic "0". As a result, the light emitting diode 44 and the light emitting diodes lower in order than the diode 44 are made to light.

Thus, the level of the digital signal is indicated as 3 dB, with the level of 0 dB at full-scale.

As described above, in the conventional digital level display device, a conversion circuit for logarithmically converting the absolute value signal for display in dB is constituted by the decoders 11, 12, .... A conversion circuit for converting the logarithmically converted signal into a displaying signal suitable to be displayed is constituted by the OR circuits 21, 22, .... A driving circuit is constituted by the inverters 31, 32, .... Display means is constituted by the light emitting diodes 41, 42, ..., the resistors 51, 52, ..., and the like. Therefore, there has been such a disadvantage that the step or resolution of the display is fixed. Further, there has been such a disadvantage that the conventional device cannot be applied to the case where a level of data is required to be numerically displayed in dB, even though the device can perform bar display or dot display by use of the light emitting diodes 41, 42, ....

SUMMARY OF THE INVENTION

It is therefore an object of the present invention to eliminate the foregoing disadvantages in the prior art.

It is another object of the present invention to provide a digital level display device in which even when a display mode is changed, it is not necessary to greatly change the hardware.

To attain the above objects, according to the present invention, the digital level display device comprises a first decoder for producing a logarithmic signal representing an area corresponding to an absolute value signal representing an absolute value of a digital signal. A second decoder produces a logarithmic signal representing a level in the area corresponding to the absolute value signal. An adder adds respective outputs of the first and second decoders to each other. A display circuit displays a level of the digital signal corresponding to an output of the adder.

BRIEF DESCRIPTION OF THE DRAWINGS

The present invention will be apparent from the following detailed description taken in conjunction with the accompanying drawings, wherein.

DETAILED DESCRIPTION OF THE PREFERRED EMBODIMENTS

Figures 1, 2:
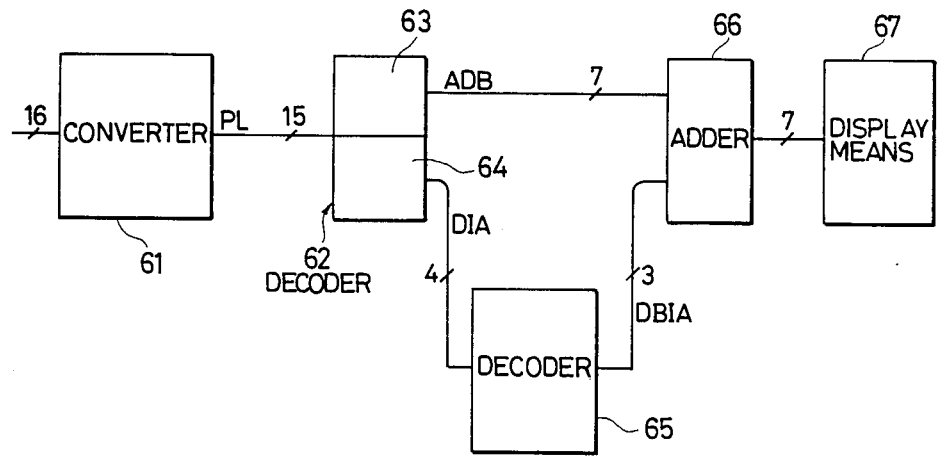
FIG. 1 is a block diagram showing an embodiment of the digital level display device according to the present invention.
FIGS. 2 and 3A–3B are tables for explaining the input/output characteristics of the decoders in the same embodiment.

FIG. 1 is a block diagram showing an embodiment of the digital level display device according to the present invention. In the drawing, a conversion circuit 61 converts a digital signal into an absolute value signal representing an absolute value of the digital signal and produces the absolute value signal at an output thereof. The absolute value signal is applied to a decoder pair 62 constituted by first and second decoders 63 and 64.

The output of the second decoder 64 is applied to a third decoder 65. The output of the third decoder 65 is added to the output of the first decoder 63 by an adder 66. This addition output is supplied to a display circuit 67.

Thus, a digital signal applied to the conversion circuit 61 is converted into an absolute value signal by the following operations. In the case where the digital signal is represented, for example, in 2's complement notation and is composed of predetermined number of a bits, the most significant bit (MSB) is coded to be "0" when the data is positive while the MSB is coded to be "1"

when the data is negative. Accordingly, in the case where data is composed, for example, of 16 bits, and when the MSB thereof is "0", that is, the data is positive, a signal composed of the remaining 15 bits is made to be an absolute value signal as it is. When the MSB of the data is "1", that is, the data is negative, for example, an exclusive OR operation of the MSB and each of the remaining bits is performed. That is, an inversion of each of the bits is performed. A "1" is added to the thus obtained value to thereby obtain an absolute value signal composed of 15 bits. Thus, the negative data is converted into the same signal (the same absolute value signal) as a signal into which positive data having a level equal to that of the negative data is converted.

The absolute value signal is applied to the decoder pair 62 so as to be logarithmically converted to a value in dB.

When one piece of data is composed of 16 bits, a dynamic range of the data is about 90 dB. The resolution of the first decoder 63 is set corresponding to the minimum value of the resolution to be displayed. That is, in the case where the level is to be displayed, for example, with the resolution of the minimum value of 1 dB, it is sufficient that the output of the first decoder 63 can express a value of about 90. Therefore, the output can be composed of 7 bits.

In the decoder section 62, as shown in FIG. 2, there are provided 6 dB ranges (#0 through #11) from 84–90 dB at full-scale to 24 dB on the basis of the most significant one of the bits of logic "1" of the absolute value signal (PL). The first decoder 63 produces a signal representing the area corresponding to the absolute value signal. That is, as the signal representing the area, a signal (an ADB signal) representing the minimum decibel level in the area is produced. In the case where the level of an absolute value signal is, for example, 80 dB, the area #1 (including the level within a range from 78 dB inclusive to 84 dB exclusive) is selected as the above-mentioned area corresponding to the absolute value signal, and the ADB signal of 7 bits "1001110" representing 78 dB is applied from the decoder 63 to the adder 66.

The second decoder 64, on the other hand, separates the data of the higher-order 4 bits following the most significant one of the bits of logic "1" as a signal representing a level in each area. For example, in the area #1, an absolute value signal of the 12th to 9th bits ($P_{12}$ through $P_9$) is separated. The separated data of 4 bits is applied to the third decoder 65 as a DIA signal.

Figures 3A, 3B, 4:
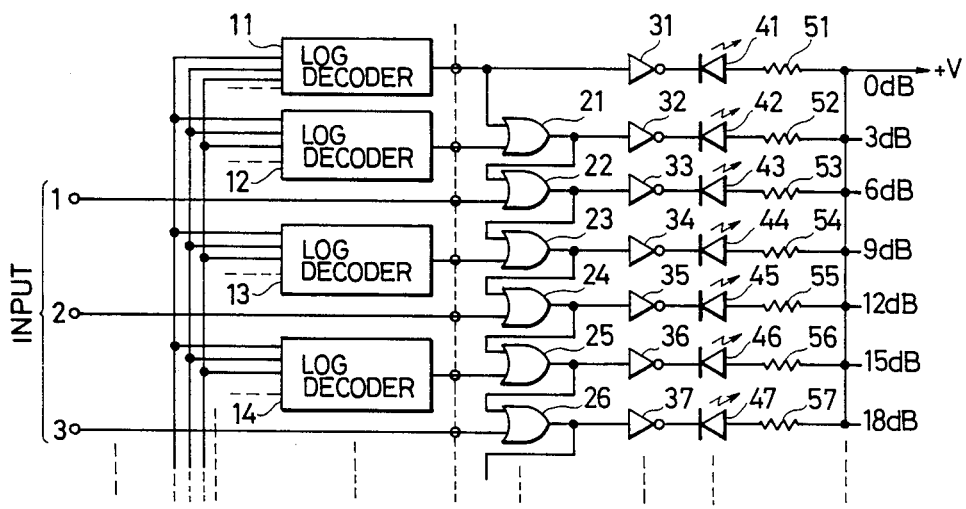
FIG. 4 is a block diagram showing an example of the conventional digital level display device.

The table in FIG. 3A shows base-10 values (correct decibel values) of data of 16 kinds of DIA signals each being represented by 4 bits. In order to make the display with 1 dB resolution, the integer values of the DBIA signal in the right column in the table of FIG. 3A are rounded off to correspond to the base-10 values respectively. Therefore, the third decoder 65 produces such values of the DBIA signal as shown in the table of FIG. 3B corresponding to the respective values of the DIA signal. The DBIA signal is constituted by 3 bits representing 6 dB at the largest. Therefore, the DBIA signal is composed of 4 bits. When the absolute value signal has a level, for example, of 80 dB, the DBIA signal to be produced is composed of 3 bits of "010", that is, the DBIA signal indicates an additional 2 dB.

In the adder 66, the ADB signal representing the area, which is produced from the first decoder 63, and the DBIA signal representing the level in the area, which is produced from the third decoder 65, are added to each other, each of the ADB signal and the DBIA signal being expressed in logarithm. This addition output corresponds to the decibel value of the absolute value signal. Upon reception of the absolute value signal having a level, for example, of 80 dB as described above, the decoder 63 produces the ADB signal of 78 dB, and the decoder 65 produces the DBIA signal of 2 dB, so that the output of the adder 66 becomes 80 dB.

The output of the adder 66 is supplied to the display circuit 67, so that the level of the digital signal is displayed with a resolution of 1 dB. The display can be a display incorporating the bar-display of the right part of FIG. 4 or may be a numerical display.

To change the step or resolution of display, it is sufficient to change the input-to-output correspondency in the decoder pair 62 and the third decoder 65. That is, a plurality of patterns for decoding may be prepared in each of the decoders 62 and 65 so that one of the patterns may be suitably selected. This applies to not only the case of bar-display and dot-display but the case of numerical display.

Further, in the case where all the bits of the absolute value signal (PL) are logic "1", the arrangement of the device may be made such that a signal of "1010100" is produced as the ADB signal and a signal of "1111" is produced as the DIA signal. A 1-bit signal representing overflow is produced from the adder 66 to the display circuit 67 to thereby display the level of the absolute value signal. In this case, the signal transferred from the adder 66 to the display circuit 67 is composed of 8 bits in all.

As described above, according to the present invention, the digital level display device comprises a first decoder for producing a logarithmic signal representing an area corresponding to an absolute value signal representing an absolute value of a digital signal, a second decoder for producing a logarithmic signal representing a level within the area corresponding to the absolute value signal, an adder for adding respective outputs of the first and second decoders to each other, and a display circuit for displaying a level of the digital signal corresponding to an output of the adder. Accordingly, even when a display mode is changed, it is not necessary to significantly change the hardware.

What is claimed is:
1. A digital level display device, comprising:
   a first decoder for producing a first signal corresponding to a binary-coded decimal (BCD) representation of a logarithm of a value of a digital signal within a range;
   a second decoder for producing a second signal representing a level within said range and corresponding to a BCD representation of said logarithm of said level;
   an adder for adding said first and second signals to each other and providing an output accordingly; and
   a display circuit for displaying a level of said digital signal corresponding to said output of said adder.
2. A digital level display device as recited in claim 1, wherein said value is an absolute value of said digital signal.
3. A digital level display device, comprising:
   a first decoder for producing a first signal representing a high order part of a binary-coded decimal (BCD) representation of a logarithm of a digital signal;

a second decoder for producing a second signal representing a low order part of said BCD representation of said logarithm of said digital signal;

an adder for adding said first and second signals and providing an output accordingly; and a display for displaying said output of said adder.

4. A digital level display device as recited in claim 3, wherein said second decoder provides said second signal in binary form rounded off according to base-10 arithmetic.

5. A digital level display device as recited in claim 3, wherein said display is a numerical display.

6. A digital level display device as recited in claim 3, wherein said second decoder produces a logarithm of all binary bits of lower order than a highest order non-zero binary bit of said digital signal.

7. A digital level display device as recited in claim 3, wherein said adder adds a multi-bit output from said second decoder.

8. A digital level display device as recited in claim 1, further comprising absolute value conversion means for receiving an original signal and outputting said digital signal as an absolute value representation of said original signal.

9. A digital level display device as recited in claim 8, wherein said original signal comprises 16 bits and said digital signal comprises 15 bits.

10. A digital level display device as recited in claim 9, wherein said first decoder comprises means for dividing said digital signal into first and second parts, said second decoder receiving said second part for outputting said second signal.

11. A digital level display device as recited in claim 3, further comprising absolute value conversion means for receiving an original signal and outputting said digital signal as an absolute value representation of said original signal.

12. A digital level display device as recited in claim 11, wherein said original signal comprises 16 bits and said digital signal comprises 15 bits.

13. A digital level display device as recited in claim 12, wherein said first decoder comprises means for dividing said digital signal into first and second parts, said second decoder receiving said second part for outputting said second signal.

* * * * *